United States Patent
Sullivan et al.

(10) Patent No.: US 6,528,804 B1
(45) Date of Patent: Mar. 4, 2003

(54) METHOD AND APPARATUS FOR LOW ENERGY ION IMPLANTATION

(75) Inventors: Philip Sullivan, Danvers, MA (US); George M. Gammel, Marblehead, MA (US); Damian F. Brennan, Gloucester, MA (US)

(73) Assignee: Varian Semiconductor Equipment Associate, Inc., Gloucester, MA (US)

( * ) Notice: Subject to any disclaimer, the term of this patent is extended or adjusted under 35 U.S.C. 154(b) by 0 days.

(21) Appl. No.: 09/524,170

(22) Filed: Mar. 13, 2000

Related U.S. Application Data

(63) Continuation of application No. 09/083,904, filed on May 22, 1998, now abandoned.

(51) Int. Cl.[7] .............................. H01J 37/08; H01J 7/24; H05B 31/26
(52) U.S. Cl. ............. 250/492.21; 250/398; 250/492.24; 315/111.81
(58) Field of Search ........................... 250/492.21, 398, 250/251; 315/111.81

(56) References Cited

U.S. PATENT DOCUMENTS

| | | | |
|---|---|---|---|
| 3,908,183 A | | 9/1975 | Ennis, Jr. .................... 357/65 |
| 4,011,449 A | | 3/1977 | Ko et al. ............... 250/492.21 |
| 4,135,097 A | * | 1/1979 | Forneris et al. .......... 250/492.3 |
| 4,276,477 A | | 6/1981 | Enge .......................... 250/398 |
| 4,283,631 A | | 8/1981 | Turner ..................... 250/492 B |
| 4,899,059 A | | 2/1990 | Frevtsis et al. .......... 250/492.2 |
| 4,922,106 A | | 5/1990 | Berrian et al. ........... 250/492.2 |
| 4,946,706 A | * | 8/1990 | Fukuda ........................ 427/455 |
| 5,089,710 A | * | 2/1992 | Kikuchi et al. .......... 250/492.3 |
| 5,126,575 A | | 6/1992 | White ..................... 250/492.3 |
| 5,293,508 A | * | 3/1994 | Shiratake et al. ...... 250/492.21 |
| 5,319,212 A | * | 6/1994 | Tokoro .................. 250/492.21 |
| 5,343,047 A | | 8/1994 | Ono et al. .................... 250/251 |
| 5,350,926 A | | 9/1994 | White et al. ........... 250/492.21 |
| 5,393,985 A | | 2/1995 | Yamakage et al. ..... 250/492.21 |
| 5,399,871 A | | 3/1995 | Ito et al. ...................... 250/251 |
| 5,668,368 A | * | 9/1997 | Sakai et al. ................. 250/251 |
| 5,747,936 A | | 5/1998 | Harrison et al. ........ 250/492.21 |
| 5,767,522 A | | 6/1998 | Kodama ..................... 250/398 |
| 5,909,031 A | * | 6/1999 | Kellerman et al. .... 250/492.21 |
| 5,932,882 A | | 8/1999 | England et al. ........ 250/492.21 |
| 5,945,681 A | * | 8/1999 | Tokiguchi et al. ..... 250/492.21 |
| 5,969,366 A | | 10/1999 | England et al. ........ 250/492.21 |

FOREIGN PATENT DOCUMENTS

| | | |
|---|---|---|
| EP | 0 451 907 A1 | 10/1991 |
| EP | 0 685 872 A1 | 12/1995 |

OTHER PUBLICATIONS

S. N. Hong et al, "Formation of Ultrashallow P+ −n Junctions by Low–Energy Boron Implantation Using a Modified Ion Implanter," Appl. Phys. Lett. 53 (18), Oct. 31, 1988, pp. 1741–1743.

A. Kluge et al, "A Flexible Target Chamber for a Varian 350 DF Implanter," Nuclear Inst. & Methods in Physics Research B37/38 (1989) pp. 584–587.

* cited by examiner

Primary Examiner—Jack Berman
Assistant Examiner—Kalimah Fernandez

(57) ABSTRACT

An ion implanter for low energy ion implantation includes an ion beam generator, a older for supporting a workpiece, such as a semiconductor wafer, and a voltage source electrically connected to the workpiece. The ion beam generator includes an ion source for generating ions and an extraction electrode having an extraction voltage applied thereto for accelerating the ions to form an ion beam. The voltage source applies to the workpiece a bias voltage that is of opposite polarity and smaller magnitude than the extraction voltage. The ions in the ion beam are implanted in the workpiece with an energy that is a function of the difference between the extraction voltage and the bias voltage.

17 Claims, 3 Drawing Sheets

METHOD AND APPARATUS FOR LOW ENERGY ION IMPLANTATION

CROSS REFERENCE TO RELATED APPLICATION

This application is a continuation of application Ser. No. 09/083,904 filed May 22, 1998 and now abandoned.

FIELD OF THE INVENTION

This invention relates to systems and methods for ion implantation of a workpiece and, more particularly, to methods and apparatus for ion implantation of semiconductor wafers with low energy ions.

BACKGROUND OF THE INVENTION

Ion implantation has become a standard technique for introducing conductivity-altering impurities into semiconductor wafers. A desired impurity material is ionized in an ion source, the ions are accelerated to form an ion beam of prescribed energy and the ion beam is directed at the surface of the wafer. The energetic ions in the beam penetrate into the bulk of the semiconductor material and are embedded into the crystalline lattice of the semiconductor material to form a region of desired conductivity.

Ion implantation systems usually include an ion source for converting a gas or solid material into a well-defined ion beam. The ion beam is mass analyzed to eliminate undesired ion species, is accelerated to a desired energy and is directed onto a target plane. The beam is distributed over the target area by beam scanning, by target movement or by a combination of beam scanning and target movement. Examples of prior art ion implanters are disclosed in U.S. Pat. No. 4,276,477 issued Jun. 30, 1981 Enge; U.S. Pat. No. 4,283,631 issued Aug. 11, 1981 to Turner; U.S. Pat. No. 4,899,059 issued Feb. 6, 1990 to Freytsis et al; and U.S. Pat. No. 4,922,106 issued May 1, 1990 Berrian et al.

A well-known trend in the semiconductor industry is toward smaller, higher speed devices. In particular, both the lateral dimensions and the depths of features in semiconductor devices are decreasing. State of the art semiconductor devices require junction depths less than 1000 angstroms and may eventually require junction depths on the order of 200 angstroms or less.

The implanted depth of the dopant material is determined, at least in part, by the energy of the ions implanted into the semiconductor wafer. Shallow junctions are obtained with low implant energies. Ion implanters are typically designed for efficient operation at relatively high implant energies, for example in the range of 50 keV to 400 keV, and may not function efficiently at the energies required for shallow junction implantation. At low implant energies, such as energies of 2 keV and lower, the current delivered to the wafer is much lower than desired and in some cases may be near zero. As a result, extremely long implant times are required to achieve a specified dose, and throughput is adversely affected. Such reduction in throughput increases fabrication cost and is unacceptable to semiconductor device manufacturers.

In one prior art approach to low energy ion implantation, the ion implanter is operated in a drift mode with the accelerator turned off. Ions are extracted from the ion source at low voltage and simply drift from the ion source to the target semiconductor wafer. However, a small ion current is delivered to the wafer because the ion source operates inefficiently at low extraction voltages. In addition, the ion beam expands as it is transported through the ion implanter, and ions may strike components of the ion implanter rather than the target semiconductor wafer.

Another prior art approach utilizes a deceleration electrode in the vicinity of the semiconductor wafer. Ions are extracted from the ion source at a higher voltage and then are decelerated by the deceleration electrode before being implanted into the wafer. This approach also suffers from ion beam expansion, such that only a small fraction of the ions generated by the source are incident on the target semiconductor wafer.

Accordingly, there is a need for improved methods and apparatus for low energy ion implantation.

SUMMARY OF THE INVENTION

According to a first aspect of the invention, an ion implanter is provided. The ion implanter comprises an ion beam generator including an ion source for generating ions and an extraction electrode having an extraction voltage applied thereto for accelerating the ions to form an ion beam, a holder for supporting a workpiece in the ion beam and a voltage generating circuit electrically connected to the workpiece. The voltage generating circuit applies to the workpiece a bias voltage that is of opposite polarity and smaller magnitude than the extraction voltage. The ions in the ion beam are implanted in the workpiece with an energy that is a function of the difference between the extraction voltage and the bias voltage.

The holder is preferably configured for supporting one or more semiconductor wafers. In one example, the holder comprises a disk for supporting a plurality of semiconductor wafers and a motor for spinning the disk so that the semiconductor wafers pass through the ion beam. The wafers may be in electrical contact with the disk. The ion implanter may further comprise dose electronics for measuring the dose of ions implanted in the wafers. The voltage generating circuit may comprise a power supply connected between the disk and the dose electronics. The bias voltage is typically in the range of about 0 to 2 kilovolts.

The ion implanter may further comprise a Faraday system positioned in front of the semiconductor wafer and means for biasing the Faraday system at the bias voltage. A plasma flood gun may be mounted in the Faraday system.

According to another aspect of the invention, a method for low energy ion implantation is provided. The method comprises the steps of generating ions in a source, accelerating the ions with a first voltage to form an ion beam, positioning a workpiece in the ion beam, and decelerating the ions in the ion beam by applying to the workpiece a second voltage that is of opposite polarity and smaller magnitude than the first voltage. The ions in the ion beam are implanted in the workpiece with an energy that is a function of the difference between the first and second voltages.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
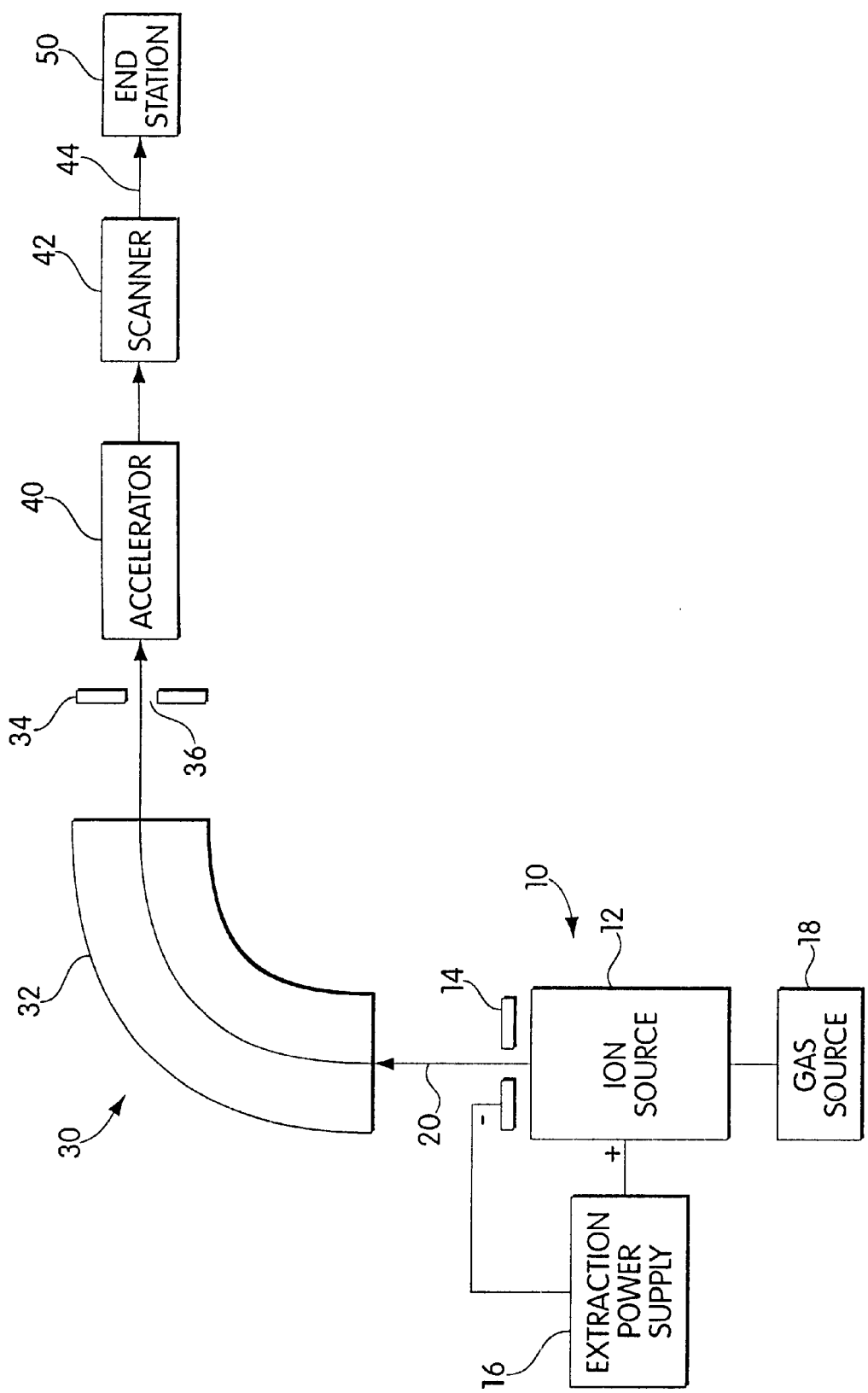
FIG. 1 is a block diagram of an example of an ion implanter suitable for incorporation of the present invention.

A block diagram of an example of an ion implanter suitable for incorporation of the present invention is shown in FIG. 1. An ion beam generator 10 includes an ion source 12 for generating ions of a desired dopant material, an extraction electrode 14 positioned in proximity to an aperture in ion source 12, an extraction power supply 16 for biasing extraction electrode 14 negatively with respect to ion source 12 and a gas source 18 for supplying a gas to be ionized to ion source 12. Ions are extracted from ion source 12 by extraction electrode 14 to form an ion beam 20. A mass analyzer 30, which may include an analyzer magnet 32 and a mask 34 having a resolving aperture 36, selects a desired ion species from the particles generated by the ion beam generator 10. The desired ion species passes through resolving aperture 36 to an accelerator 40. Accelerator 40 accelerates ions in the ion beam 20 to desired energies. A scanner 42 deflects the ion beam to produce a scanned ion beam 44. An end station 50 supports one or more semiconductor wafers or other workpieces in the path of scanned ion beam 44 such that ions of the desired species are implanted into the semiconductor wafers.

The ion implanter may include additional components known to those skilled in the art. For example, end station 50 typically includes automated wafer handling equipment for introducing wafers into the ion implanter and for removing wafers after implantation. It will be understood that the entire path traversed by the ion beam is evacuated during ion implantation. A variety of different ion implanter configurations are known to those skilled in the art.

As indicated above, some applications requires implantation of ions into wafers at end station 50 at low implant energies, such as 2 keV or less. The low implant energies permit shallow junction semiconductor devices to be fabricated. One prior art approach is to turn accelerator 40 off and to operate extraction power supply 16 at the required implant voltage. However, ion beam generators typically do not function efficiently at extraction voltages of 2 keV or less. Furthermore, the low energy ion beam expands as it is transported through the ion implanter, and ions in the beam may strike implanter components other than the semiconductor wafer in end station 50. A small ion current is delivered to the wafer, thus requiring long implant times to achieve a specified dose. As a result, prior art operation at low energies was inefficient.

Figure 2:
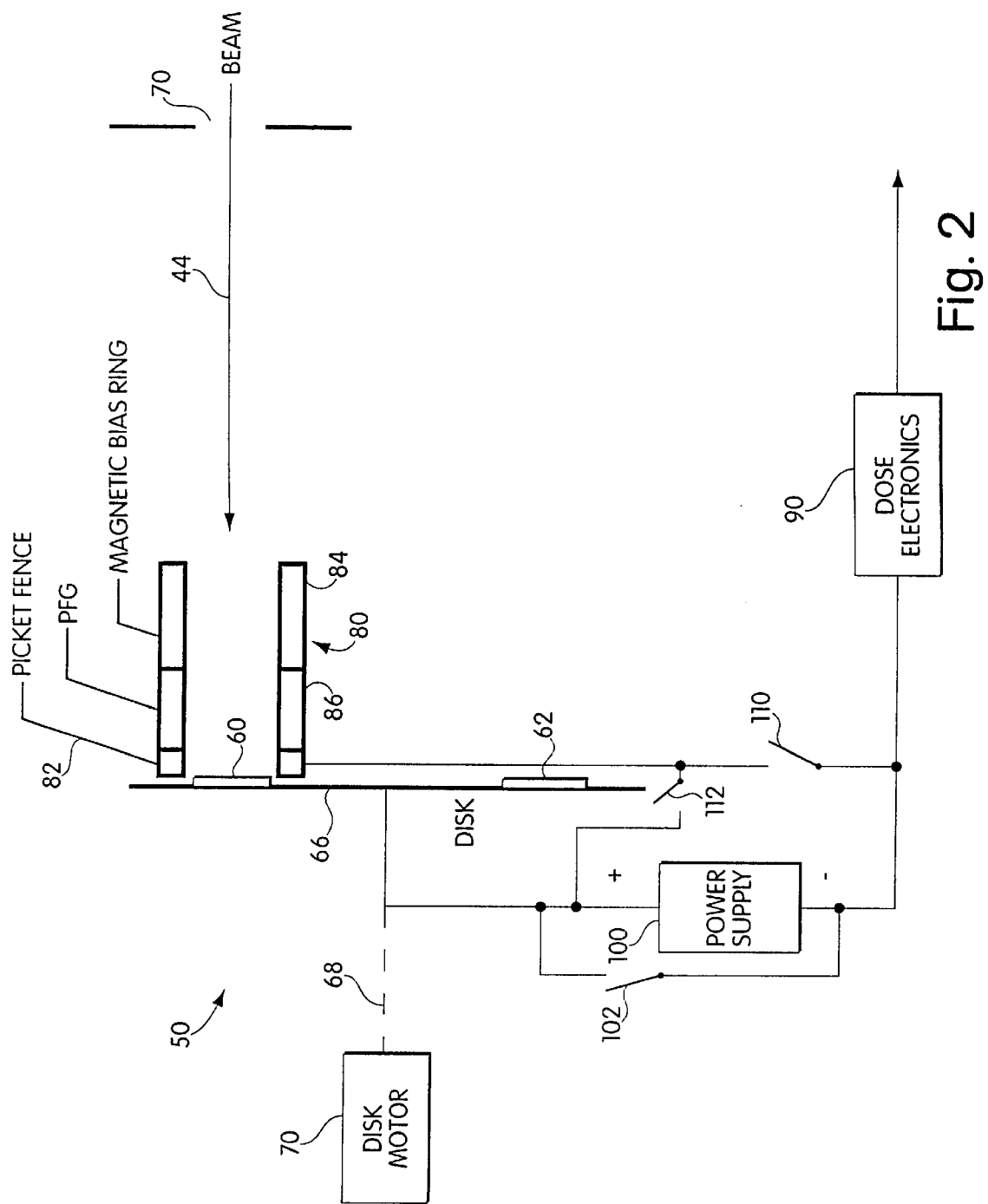
FIG. 2 is a schematic diagram of the end station wherein a bias voltage is applied to the wafer.

A schematic diagram of an example of end station 50 in accordance with the invention is shown in FIG. 2. Semiconductor wafers, such as wafers 60 and 62, are mounted near the periphery of a wafer support disk 66. Disk 66 is coupled to a disk motor 70 and rotates about an axis 68 when motor 70 is energized. A typical disk may include sites for mounting 13 wafers. The wafer mounting sites may be tilted relative to axis 68 to provide centrifugal clamping as known in the art. Ion beam 44 enters end station 50 through an entrance aperture 70 and is incident on wafer 60. As disk 66 rotates, different wafers on disk 66 are exposed to ion beam 44.

A Faraday system 80 is positioned in front of disk 66 such that ion beam 44 passes through the Faraday system 80. Faraday system 80 is used for measuring ion dose implanted in the wafers. The Faraday system may include an electrode 82 adjacent to wafer 60 and a magnetic bias ring 84. In addition, Faraday system 80 may include a plasma flood gun 86 for controlling charge buildup on the wafers being implanted. Electrode 82, magnetic bias ring 84 and plasma flood gun 86 typically have a common electrical potential.

Disk 66 and Faraday system 80 are electrically connected to dose electronics 90, which monitors the ion dose implanted in the wafers.

In accordance with the invention, the wafers being implanted are biased at a positive voltage. The bias voltage decelerates the ions in ion beam 44 so that they are implanted at low energies. The wafers are preferably biased at a positive bias voltage in a range of about 0 to 2 kilovolts. However, the bias voltage is not limited to this range. The bias voltage permits the extraction power supply 16 (FIG. 1) to be set at a higher voltage, so that ions are more efficiently extracted from ion source 12 and transported through the implanter to end station 50. The ions are decelerated by the bias voltage and are implanted into the wafers at low energies. As a result, relatively high beam currents can be delivered at very low energies.

For the typical case of positive ions in the ion beam, the extraction electrode 14 is biased negatively relative to ion source 12, and the wafer being implanted is biased positively relative to ground. As a result, ions in the ion beam are accelerated by the extraction voltage applied to extraction electrode 14 and are decelerated by the bias voltage applied to the wafer. The extraction voltage has a larger magnitude than the bias voltage. Thus, the implant energy is a function of the difference between the extraction voltage and the bias voltage.

An implementation of the invention is described with reference to FIG. 2. A voltage generating circuit, which may be an electrically floating power supply 100, is electrically connected between disk 66 and dose electronics 90. Power supply 100 may be adjustable in the range between 0 volts and 2 kilovolts. Disk 66 is a conductive material and is in electrical contact with the wafers 60, 62, etc. mounted thereon. Dose electronics 90 is typically grounded. Thus, power supply 100 applies a positive bias voltage in the range of 0 to 2 kilovolts to wafers 60 and 62. Power supply 100 may be replaced with any suitable voltage generating circuit, such as a series resistor having a value selected to produce the desired bias voltage at a nominal operating current. A switch 102 may be connected across the terminals of power supply 100. When switch 102 is closed, power supply 100 is effectively inhibited, and disk 66 is operated at or near ground potential. Switch 102 is closed during ion implantation at higher energy levels and is open for low energy implants. When switch 102 is open, a bias voltage established by power supply 100 is applied to wafers 60, 62, etc.

The ground electrode 82 of Faraday system 80 is connected through a switch 110 to the negative terminal of power supply 100 and is connected through a switch 112 to the positive terminal of power supply 100. During low energy implants, switch 112 is closed and switch 110 is open. Thus, electrode 82 is biased at the voltage of power supply I 00 and is equal in potential to disk 66 and wafers 60 and 62. For higher energy implants when power supply 100 is inhibited from applying a bias voltage to wafers 60 and 62, switch 112 is open and switch 110 is closed, so that electrode 82 is maintained at or near ground potential. In summary, Faraday system 80 is preferably biased at the same voltage as wafers 60 and 62 for both low energy and high energy implants in order to ensure proper operation of the plasma flood gun 86.

Figure 3:
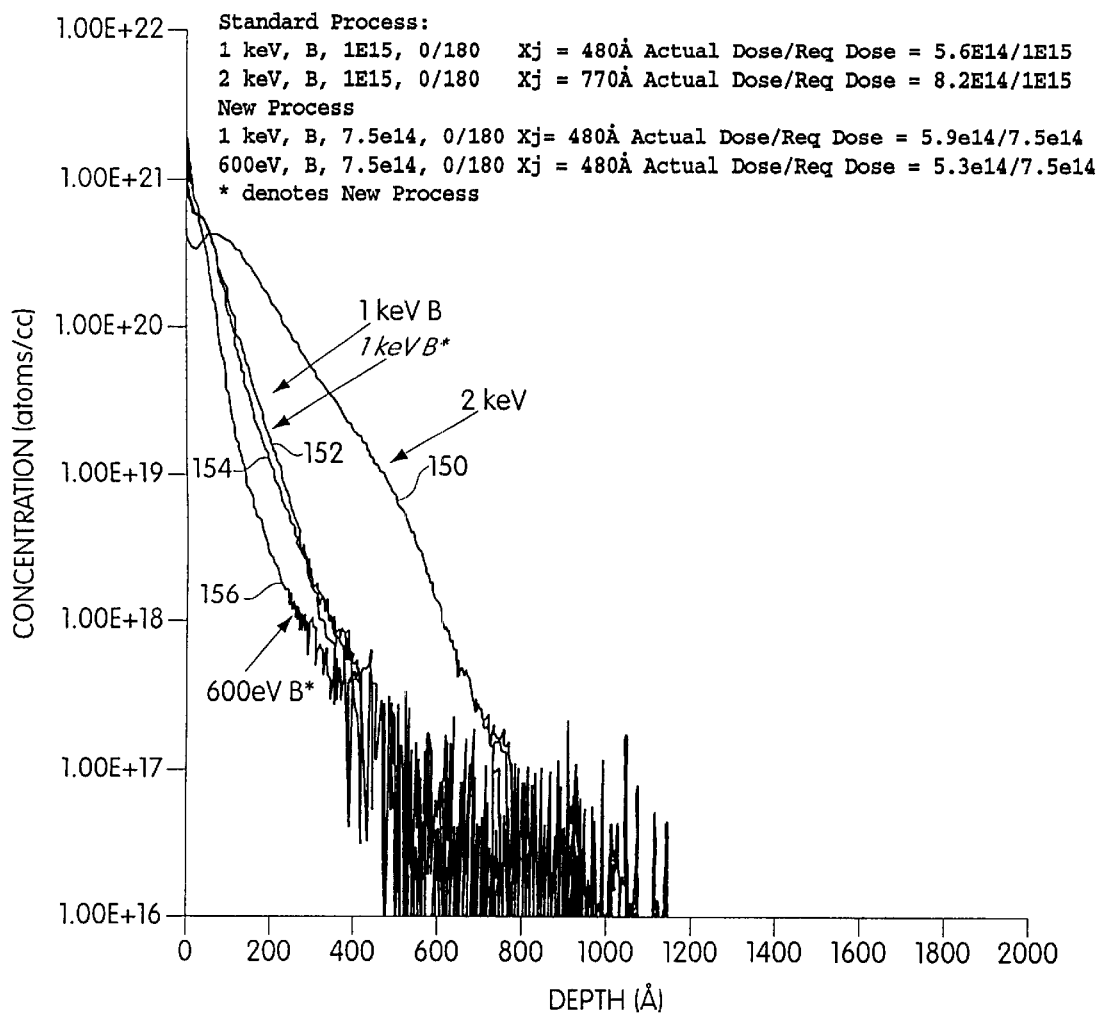
FIG. 3 is a graph of concentration in atoms per cubic centimeter as a function of depth in angstroms, showing the implant profile of wafers implanted in accordance with the invention and in accordance with prior art implantation techniques.

Implant profiles in accordance with the prior art and in accordance with the present invention are illustrated in FIG. 3. Boron ion concentration in atoms per cubic centimeter is plotted as a function depth in angstroms from the surface of the semiconductor wafer. Curves 150 and 152 represent implants in accordance with the prior art technique, and curves 154 and 156 represent implants in accordance with the invention. The prior art implants were made with an implanter operating in the drift mode, where the implant energy is determined by the extraction voltage utilized in the ion beam generator, and no bias voltage is applied to the wafer. In the implants in accordance with the invention, the wafer was biased at 2 kilovolts and the extraction electrode in the ion beam generator was biased to achieve the desired implant energy. For example, an extraction voltage of 3 kilovolts and a bias voltage of 2 kilovolts gives an implant energy of 1 keV. It may be observed that the prior art implant at 1 keV (curve 152) and the implant in accordance with the invention at 1 keV (curve 154) gave nearly identical implant profiles. However, the 1 keV implant in accordance with the invention was completed in 20 minutes, whereas the prior art implant at 1 keV required 400 minutes due to low ion current. An implant could not be performed at 600 electron volts using the prior art configuration.

A comparison of ion beam current at different implant energies in accordance with the prior art and utilizing a bias voltage applied to the wafer in accordance with the invention is shown in Table 1 below. According to the invention, the wafer was biased at 2 kilovolts and the extraction voltage was set to achieve the desired implant energy. Thus, for example, to achieve an implant energy of 1 keV, the extraction voltage was set to 3 kilovolts and the bias voltage was set to 2 kilovolts. In the prior art configuration, the wafer was grounded and the implant energy was established by the extraction voltage of the ion beam generator. It may be observed that the ion beam current is significantly higher utilizing a bias voltage in accordance with the invention. For example, at an implant energy of 1 keV, the configuration of the present invention provides an ion beam current 1 milliamp, whereas the prior art configuration provided an ion beam current of only 0.08 milliamp.

TABLE 1

| Implant Energy | Beam Current in milliamps | |
|---|---|---|
| | Prior Art | Invention |
| 5 keV | 5 | 7 |
| 4 keV | 3 | 4 |
| 3 keV | 2 | 3 |
| 2 keV | 1 | 2 |
| 1 kev | 0.08 | 1 |
| 500 eV | N/A | 0.7 |
| 250 ev | N/A | 0.5 |

The invention has been described in connection with an end station configuration which utilizes a rotating disk for mounting semiconductor wafers. A variety of different end station configurations are known to those skilled in the art. For example, the end station may be configured for implanting one wafer at a time. Furthermore, a variety of different wafer clamping techniques, including centrifugal, electrostatic and peripheral clamping ring, may be utilized. In each case, a bias voltage may be applied to the wafer. The bias voltage and the extraction voltage of the ion beam generator are selected such that the difference between the extraction voltage and the bias voltage gives the desired implant energy. The extraction voltage is selected to provide an acceptable level of ion current at the wafer.

While there have been shown and described what are at present considered the preferred embodiments of the present invention, it will be obvious to those skilled in the art that various changes and modifications may be made therein without departing from the scope of the invention as defined by the appended claims.

What is claimed is:

1. An ion implanter comprising:
   an ion beam generator including an ion source for generating ions and an extraction electrode having an extraction voltage applied thereto for accelerating said ions to form an ion beam;
   a holder for supporting a workpiece in said ion beam;
   a Faraday system positioned in front of the workpiece; and
   a voltage generating circuit in electrical contact with the workpiece for applying to the workpiece and to the Faraday system a bias voltage that is of opposite polarity and smaller magnitude than said extraction voltage, wherein the ions in said ion beam are implanted in the workpiece with an energy that is a function of the difference between said extraction voltage and said bias voltage.

2. An ion implanter as defined in claim 1 wherein said holder is configured for supporting at least one semiconductor wafer.

3. An ion implanter as defined in claim 1 wherein said holder comprises a disk for supporting a plurality of semiconductor wafers and a motor for spinning said disk so that said semiconductor wafers pass through said ion beam.

4. An ion implanter as defined in claim 3 wherein said semiconductor wafers are in electrical contact with said disk and wherein said voltage generating circuit applies said bias voltage to said disk.

5. An ion implanter as defined in claim 4 further comprising dose electronics for measuring the dose of said ions implanted in said semiconductor wafers, wherein said voltage generating circuit comprises a power supply connected between said disk and said dose electronics.

6. An ion implanter as defined in claim 5 further including means for inhibiting said bias voltage above a selected level of implant energy.

7. An ion implanter as defined in claim 2 further comprising dose electronics for measuring the dose of said ions implanted in said semiconductor wafer, wherein said voltage generating circuit comprises a power supply connected between said semiconductor wafer and said dose electronics.

8. An ion implanter as defined in claim 2 further comprising dose electronics for measuring the dose of said ions implanted in said semiconductor wafer, wherein said voltage generating circuit comprises a resistor connected between said semiconductor wafer and said dose electronics.

9. An ion implanter as defined in claim 1 wherein said voltage generating circuit comprises a power supply electrically connected to the workpiece.

10. An ion implanter as defined in claim 1 wherein said bias voltage is in a range of about 0 to 2 kilovolts.

11. A method for low energy ion implantation, comprising the steps of:
    generating ions in an ion source;
    accelerating said ions with a first voltage to form an ion beam;
    positioning a workpiece in said ion beam;
    positioning a Faraday system in front of the workpiece; and
    decelerating the ions in said ion beam by applying to the workpiece and to the Faraday system a second voltage that is of opposite polarity and smaller magnitude than said first voltage, wherein the ions in said ion beam are implanted in the workpiece with an energy that is a function of the difference between said first and second voltages.

12. A method for low energy ion implantation as defined in claim 11 wherein the step of positioning a workpiece comprises supporting a semiconductor workpiece in said ion beam.

13. A method for low energy ion implantation as defined in claim 11 wherein the step of positioning a workpiece comprises supporting a plurality of semiconductor wafers on a disk and spinning said disk so that said semiconductor wafers pass through said ion beam.

14. A method for low energy ion implantation as defined in claim 13 wherein the step of applying a second voltage to the workpiece comprises applying a bias voltage to said disk.

15. A method for low energy ion implantation as defined in claim 11 further including the step of removing said second voltage from said workpiece above a selected level of implant energy.

16. An ion implanter comprising:

an ion beam generator for generating an ion beam comprising ions of a first energy established by a first voltage;

a holder for supporting a workpiece in said ion beam;

a Faraday system positioned in front of the workpiece; and a voltage source for applying to the workpiece and to the Faraday system a second voltage that is of opposite polarity and smaller magnitude than said first voltage, wherein the ions in said ion beam are implanted into the workpiece with an energy that is a function of the difference between said first and second voltages.

17. An ion implanter as defined in claim 16 wherein said holder is configured for supporting at least one semiconductor wafer.

* * * * *